(12) United States Patent
Hawtof et al.

(10) Patent No.: US 7,344,901 B2
(45) Date of Patent: Mar. 18, 2008

(54) HERMETICALLY SEALED PACKAGE AND METHOD OF FABRICATING OF A HERMETICALLY SEALED PACKAGE

(75) Inventors: Daniel W. Hawtof, Corning, NY (US); Kamjula Pattabhirami Reddy, Corning, NY (US); John Stone, III, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 458 days.

(21) Appl. No.: 10/964,972

(22) Filed: Oct. 13, 2004

(65) Prior Publication Data

US 2005/0151151 A1  Jul. 14, 2005

Related U.S. Application Data

(63) Continuation-in-part of application No. 10/414,653, filed on Apr. 16, 2003, now abandoned.

(51) Int. Cl.
*H01L 21/00* (2006.01)

(52) U.S. Cl. .................. 438/26; 257/E21.499

(58) Field of Classification Search ........ 257/E33.055, 257/E33.056, E33.058, E33.059, E33.06, 257/E23.116, E23.118, E23.124, E23.125, 257/E23.127, E23.128, E21.499, E21.502
See application file for complete search history.

(56) References Cited

U.S. PATENT DOCUMENTS

| | | | |
|---|---|---|---|
| 3,723,835 A | 3/1973 | Davis et al. | 257/794 |
| 3,778,126 A | 12/1973 | Wilson | 316/20 |
| 3,885,974 A | 5/1975 | Asahara et al. | 106/47 Q |
| 3,973,975 A | 8/1976 | Francel et al. | 106/53 |
| 3,995,941 A | 12/1976 | Nagahara et al. | 350/160 |
| 4,206,382 A | 6/1980 | DuBois | 313/331 |
| 4,238,704 A | 12/1980 | Bonk et al. | 313/113 |
| 4,400,870 A | 8/1983 | Islam | 29/588 |
| 4,446,399 A | 5/1984 | Endo et al. | 313/505 |
| 5,304,518 A | 4/1994 | Sunahara et al. | 501/62 |
| 5,489,321 A | 2/1996 | Tracy et al. | 65/43 |
| 5,641,611 A | 6/1997 | Shich et al. | 438/35 |
| 5,682,453 A | 10/1997 | Daniel et al. | 385/99 |
| 5,693,111 A | 12/1997 | Kadowaki et al. | 65/43 |
| 5,693,956 A | 12/1997 | Shi et al. | 257/40 |
| 5,734,225 A | 3/1998 | Biebuyck et al. | 313/512 |
| 5,771,562 A | 6/1998 | Harvey, III et al. | 29/592.1 |

(Continued)

FOREIGN PATENT DOCUMENTS

GB  1298397  4/1970

(Continued)

OTHER PUBLICATIONS

"Corning® EAGLE$^{2000}$™ AMLCD Glass Substrates", MIE 201, Aug. 2002, pp. 1-3.

(Continued)

*Primary Examiner*—Scott B. Geyer
(74) *Attorney, Agent, or Firm*—Kevin M. Able

(57) ABSTRACT

A method and apparatus for forming a hermetic seal between two substrates includes providing an electromagnetic absorbent sealing material perimetrically about a surface of one of the substrates. Furthermore, the illustrative method includes heating the sealing material. In addition, a package having a hermetic seal and apparati for disposing a sealing material are described.

25 Claims, 4 Drawing Sheets

U.S. PATENT DOCUMENTS

| | | | |
|---|---|---|---|
| 5,821,692 A | 10/1998 | Rogers et al. | 313/512 |
| 5,855,994 A | 1/1999 | Biebuyck et al. | 428/209 |
| 5,872,355 A | 2/1999 | Hueschen | 250/208.1 |
| 5,874,804 A | 2/1999 | Rogers | 313/512 |
| 5,895,228 A | 4/1999 | Biebuyck et al. | 438/99 |
| 5,920,080 A | 7/1999 | Jones | 257/40 |
| 5,929,474 A | 7/1999 | Huang et al. | 257/292 |
| 5,952,778 A | 9/1999 | Haskal et al. | 313/504 |
| 5,962,962 A | 10/1999 | Fujita et al. | 313/412 |
| 5,998,805 A | 12/1999 | Shi et al. | 257/40 |
| 6,069,443 A | 5/2000 | Jones et al. | 313/504 |
| 6,096,496 A | 8/2000 | Frankel | 435/4 |
| 6,137,221 A | 10/2000 | Roitman et al. | 313/504 |
| 6,146,225 A | 11/2000 | Sheats et al. | 445/24 |
| 6,226,890 B1 | 5/2001 | Boroson et al. | 34/472 |
| 6,268,695 B1 | 7/2001 | Affinito | 313/504 |
| 6,337,381 B1 | 1/2002 | Biebuyck et al. | 528/12 |
| 6,356,376 B1 | 3/2002 | Tonar et al. | 359/267 |
| 6,370,019 B1 | 4/2002 | Matthies et al. | 361/681 |
| 6,470,594 B1 | 10/2002 | Boroson et al. | 34/335 |
| 6,501,044 B1 | 12/2002 | Klockhau et al. | 219/121.64 |
| 6,555,025 B1 | 4/2003 | Krupetsky et al. | 252/512 |
| 6,608,283 B2 | 8/2003 | Liu et al. | 219/121.85 |
| 6,733,850 B1 | 5/2004 | Domi et al. | |
| 6,734,615 B2 | 5/2004 | Sugawara et al. | |
| 6,879,319 B2 * | 4/2005 | Cok | 345/173 |
| 6,936,963 B2 | 8/2005 | Langer et al. | 313/509 |
| 6,987,359 B2 | 1/2006 | Canale et al. | 313/623 |
| 6,998,776 B2 | 2/2006 | Aitken et al. | 313/512 |
| 2001/0015620 A1 | 8/2001 | Affinito | 313/512 |
| 2001/0033135 A1 | 10/2001 | Duggal et al. | 313/506 |
| 2001/0045565 A1 | 11/2001 | Yamazaki | 257/89 |
| 2001/0048234 A1 | 12/2001 | Liu et al. | 297/3 |
| 2001/0049197 A1 | 12/2001 | Yamazaki et al. | 438/689 |
| 2001/0053082 A1 | 12/2001 | Chipalkatti et al. | 362/496 |
| 2001/0055841 A1 | 12/2001 | Yamazaki et al. | 438/151 |
| 2002/0003403 A1 | 1/2002 | Ghosh et al. | 313/512 |
| 2002/0003571 A1 | 1/2002 | Shofield et al. | 348/148 |
| 2002/0004577 A1 | 1/2002 | Biebuyck et al. | 528/12 |
| 2002/0008463 A1 | 1/2002 | Roch | 313/492 |
| 2002/0015032 A1 | 2/2002 | Koyama et al. | 345/204 |
| 2002/0031874 A1 | 3/2002 | Yamazaki et al. | 438/156 |
| 2002/0035852 A1 * | 3/2002 | Wang et al. | 65/34 |
| 2002/0050958 A1 | 5/2002 | Matthies et al. | 345/55 |
| 2002/0080463 A1 | 6/2002 | Tonar et al. | 359/267 |
| 2002/0097368 A1 | 7/2002 | Kijima et al. | 349/153 |
| 2002/0109136 A1 | 8/2002 | Seo et al. | 257/40 |
| 2002/0113241 A1 | 8/2002 | Kubota et al. | 257/79 |
| 2002/0113763 A1 | 8/2002 | Koyama | 345/87 |
| 2002/0125484 A1 | 9/2002 | Silvernail et al. | 257/79 |
| 2002/0125822 A1 | 9/2002 | Graff et al. | 313/506 |
| 2002/0132047 A1 | 9/2002 | Yamazaki et al. | 427/255.6 |
| 2002/0133086 A1 | 9/2002 | Connelly et al. | 600/509 |
| 2002/0143258 A1 | 10/2002 | Weiner et al. | 600/476 |
| 2002/0149312 A1 | 10/2002 | Roberts et al. | 313/495 |
| 2002/0152800 A1 | 10/2002 | Bouten et al. | 73/38 |
| 2002/0154379 A1 | 10/2002 | Tonar et al. | 359/267 |
| 2002/0182828 A1 | 12/2002 | Asami et al. | 438/485 |
| 2002/0187254 A1 | 12/2002 | Ghosh et al. | 427/58 |
| 2002/0187594 A1 | 12/2002 | Yamazaki et al. | 438/166 |
| 2002/0190661 A1 | 12/2002 | Duggal et al. | 315/169.1 |
| 2003/0017297 A1 | 1/2003 | Song et al. | 428/68 |
| 2003/0017371 A1 | 1/2003 | Burrows et al. | 428/697 |
| 2003/0038594 A1 | 2/2003 | Seo et al. | 313/506 |
| 2003/0066311 A1 | 4/2003 | Li et al. | 65/43 |
| 2003/0124774 A1 | 7/2003 | Kosokabe | 438/127 |
| 2003/0184219 A1 | 10/2003 | Duggal et al. | 313/506 |
| 2003/0203205 A1 | 10/2003 | Bi et al. | 428/402 |
| 2003/0222061 A1 | 12/2003 | Langer, et al. | 219/121.66 |
| 2003/0227024 A1 | 12/2003 | Yoshii et al. | 257/99 |
| 2004/0069017 A1 | 4/2004 | Li et al. | |
| 2005/0001545 A1 | 1/2005 | Aitken et al. | 313/512 |
| 2006/0009109 A1 | 1/2006 | Aitken et al. | 445/24 |
| 2007/0007894 A1 | 1/2007 | Aitken et al. | 313/512 |

FOREIGN PATENT DOCUMENTS

| | | |
|---|---|---|
| JP | 58-211743 | 12/1983 |
| JP | 59-86026 | 5/1984 |
| JP | 62-078128 | 4/1987 |
| JP | 63-276894 | 11/1988 |
| JP | 01225140 | 8/1989 |
| JP | 10-074583 | 3/1998 |
| JP | 11-97169 | 4/1999 |
| JP | 11-326904 | 11/1999 |
| JP | 2001-319775 | 11/2001 |
| JP | 2003-187962 | 7/2003 |
| WO | WO93/12049 | 6/1993 |
| WO | WO97/30947 | 8/1997 |
| WO | WO99/32282 | 7/1999 |
| WO | WO 00/57499 | 9/2000 |
| WO | WO 00/69002 | 11/2000 |
| WO | WO 01/05205 | 1/2001 |
| WO | WO 01/44865 | 6/2001 |
| WO | WO 02/05361 | 1/2002 |
| WO | WO 02/21557 | 3/2002 |
| WO | WO 02/21557 A1 | 3/2002 |
| WO | WO03/005774 | 1/2003 |
| WO | WO03/100832 A2 | 12/2003 |

OTHER PUBLICATIONS

"Corning® 1737 AMLCD Glass Substrates", MIE 101, Aug. 2002, pp. 1-3.

"Laser-fabricated glass microlens arrays", Optics Letters, vol. 23, No. 2, Jan. 15, 1998, pp. 141-143.

"OLED Encapsulation", Information Display Jul. 2002, p. 26-28.

H.E. Hagy, "A Review and Recent Developments of Photoelastic Techniques for the Measurement of Thermal Expansion Differentials Using Glass Seals", Thermal Conductivity, vol. 24, pp. 279-290.

H. Hirashima et al., "Electrical Conductivity of $Fe_2O_3$-$V_2O_5$-$P_2O_5$ Glasses", Journal of the American Ceramic Society, vol. 66, No. 10, Oct. 1983, pp. 704-708.

H. Hirashina et al., "Effect of Basic Additive Oxides on Electrical Conductivity of Vanadate Glasses", Journal of Non-Crystalline Solids, vol. 95 & 96, 1987, pp. 817-824.

Standard Practice for Making Reference Glass-Metal Sandwich Seal and Testing for Expansion Characteristics by Polarimetric Methods, The American Society of Testing Materials—Designation: F144-80 (Reapproved 2000), pp. 502-506.

Milos B. Volf, "Chemical Approach to Glass", Glass Science and Technology, vol. 7, 1984, p. 349, 394, 330.

Peter C. Schultz, "Optical Absorption of the Transition Elements in Vitreous Silica", Journal of the American Ceramic Society, vol. 57, No. 7, pp. 309-313.

* cited by examiner

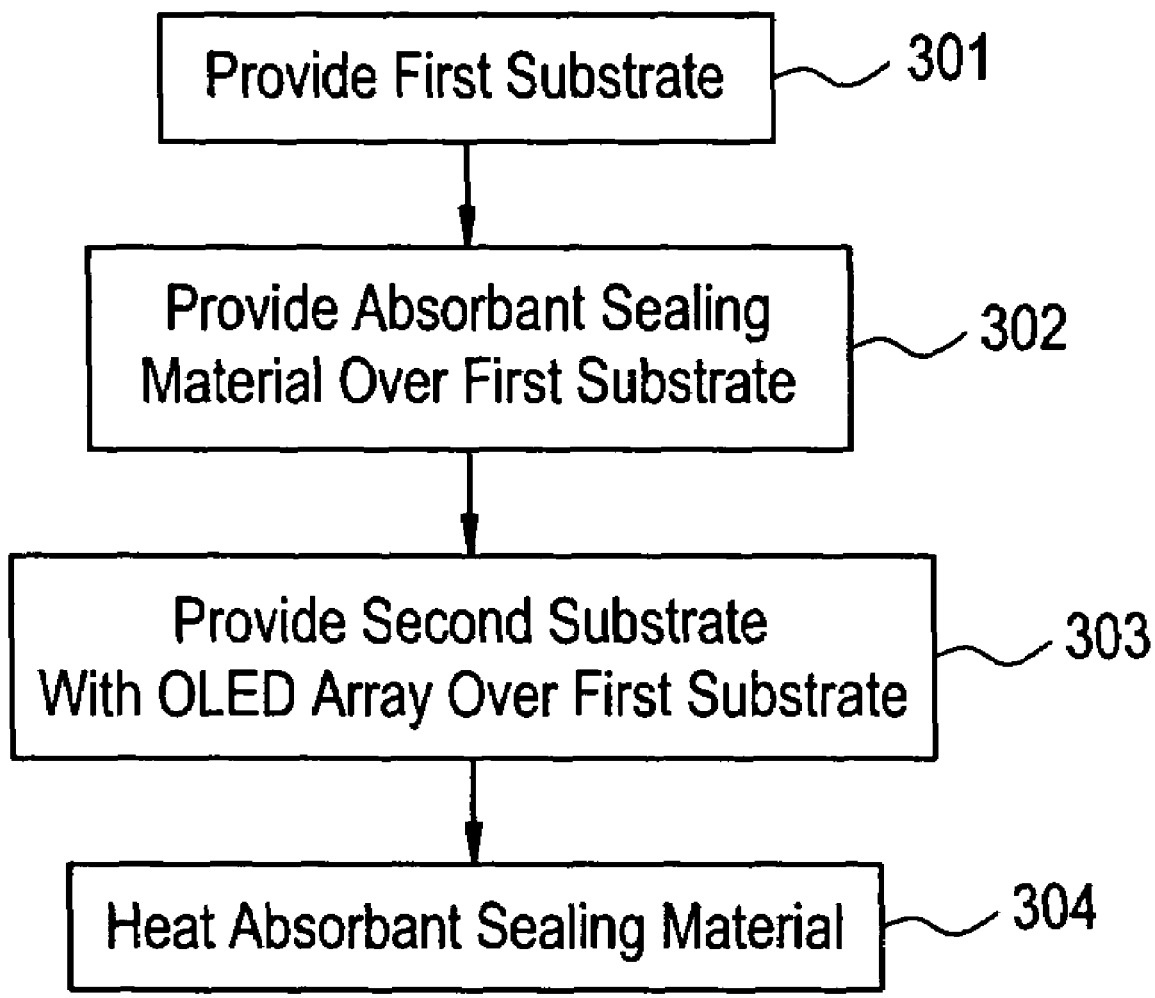

HERMETICALLY SEALED PACKAGE AND METHOD OF FABRICATING OF A HERMETICALLY SEALED PACKAGE

CROSS-REFERENCE TO RELATED APPLICATIONS

The present application is a continuation-in-part application under 35 U.S.C. § 120 of commonly-assigned U.S. patent application Ser. No. 10/414,653 filed on Apr. 16, 2003, now abandoned and entitled "Hermetically Sealed Glass Package and Method of Fabrication." The present application is also related to U.S. patent application Ser. No. 10/965,453, entitled "Hermetically Sealed Glass Package and Method of Fabrication," filed concurrently. The disclosures of these applications are specifically incorporated herein by reference.

BACKGROUND

Organic light emitting devices/diodes (OLEDs) are often made from electroluminescent polymers and small-molecule structures. These devices have received a great deal of attention as alternatives to conventional light sources in display devices, lighting devices, and other applications. For example, OLEDs in an array may provide an alternative to liquid crystal (LC) based displays, because the LC materials and structures tend to be more complicated in form and implementation.

One of the many benefits of OLED-based displays is that they do not require a light source (backlight) as needed in LC displays. To wit, OLEDs are a self-contained light source, and as such are much more compact while remaining visible under a wider range of conditions. Moreover, unlike many LC displays, which rely on a fixed cell gap, OLED-based displays can be flexible.

While OLEDs provide a light source for display and other applications with at least the benefits referenced above, there are certain considerations and limitations that can reduce their practical implementation. To wit, OLED materials are susceptible to environmental degradation. For example, exposure of an OLED display to water vapor, or oxygen, or both can be deleterious to the organic material and the electrical components of the OLED structure. As to the former, the exposure to water vapor and oxygen can reduce the light emitting capability of the organic electroluminescent material itself. As to the latter, for example, exposure to these contaminants of reactive metal cathodes commonly used in OLED displays over time can result in 'dark-spot', areas and reduce the useful life of the OLED device. Accordingly, it is beneficial to protect OLED displays and their constituent components and materials from exposure to environmental contaminants such as water vapor and oxygen.

In order to minimize environmental contamination, OLEDs must be sealed between two layers, which are often glass substrates. Moreover, the sealing process must not expose the OLED material to excessive heat to prevent destruction of the OLED material.

What is needed, therefore, is a method of sealing the glass substrates to form a hermetically sealed OLED structure that overcomes at least the shortcomings described above.

Defined Terminology

As used herein, the term 'perimetrically' may mean substantially following the contour of an edge of a surface but being a finite distance from the edge of the surface. The magnitude of the finite distance is application driven. For purposes of illustration, a material disposed perimetrically over a substrate having a rectangular outer edge is rectangular in shape with a finite distance between the material and the outer surface. It is emphasized that the defined terminology is in addition to the ordinary meaning of 'perimetrically'.

SUMMARY

In accordance with an example embodiment, a method includes providing a first substrate and providing a light absorbent sealing material over a surface of the first substrate. The illustrative method also includes providing a second substrate over the first substrate. In addition, the illustrative method includes heating the sealing material to form a hermetic seal between the sealing material and the substrate layers.

In accordance with another example embodiment, a hermetically sealed package includes a first substrate and a second substrate. The package of the illustrative embodiment also includes a second substrate; and a doped glass seal disposed perimetrically over at least one of the substrates and between the first and second substrates.

In accordance with another example embodiment, a dispensing apparatus includes a unit, which heats a light absorbing sealing material and dispenses the sealing material over a substrate; and a controller associated with the unit that adjusts the rate of the dispensing of the material by the unit.

BRIEF DESCRIPTIONS OF THE DRAWINGS

The example embodiments are best understood from the following detailed description when read with the accompanying drawing figures. It is emphasized that the various features are not necessarily drawn to scale. The dimensions may be arbitrarily increased or decreased for clarity of discussion.

FIG. 3 is a flow chart of a method of fabricating a hermetic seal in accordance with an example embodiment

DETAILED DESCRIPTION

Figure 1:
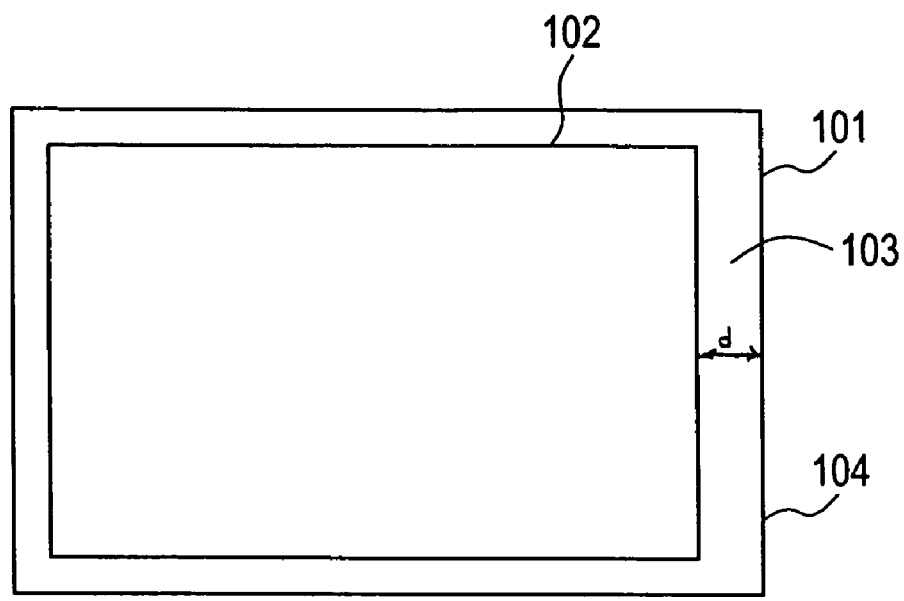
FIG. 1 is a top plan view of a first substrate having sealing material, which is absorbent of electromagnetic radiation, disposed perimetrically over the substrate.

In the following detailed description, for purposes of explanation and not limitation, example embodiments disclosing specific details are set forth in order to provide a thorough understanding of the present invention. However, it will be apparent to one having ordinary skill in the art having had the benefit of the present disclosure that the present invention may be practiced in other embodiments that depart from the specific details disclosed herein. Moreover, descriptions of well-known devices, methods and materials may be omitted so as to not obscure the description of the present invention. Finally, wherever applicable like reference numerals refer to like elements.

In the example embodiments described herein, structures for sealing OLEDs are set forth in significant detail. It is noted, however, that this is merely an illustrative implementation of the invention. To wit, the example embodiments are applicable to other technologies that are susceptible to similar contamination problems as those discussed above. For example, embodiments for sealing electronic and photonic devices and structures are clearly within the purview of the present invention. These include, but are not limited to, integrated circuits and semiconductor structures. Moreover, the example embodiments are applicable in other types of optical devices besides OLED displays including field emission displays, plasma displays, inorganic electroluminescent (EL) displays, and other optical devices where sensitive films have to be protected from the environment.

Briefly, the example embodiments relate to a method of providing a seal between a first substrate and a second substrate, where it is useful to prevent the contamination of a material(s) disposed between the substrates through exposure to water and oxygen as well as other deleterious environmental elements well within the purview of one having ordinary skill in the art. Illustratively, the seal advantageously can be provided perimetrically between the substrates and includes a glass material that by virtue of its constituent elements absorbs electromagnetic radiation at a particular wavelength or over one or more particular wavelength ranges.

In certain illustrative embodiments described herein, a laser provides the electromagnetic radiation. However, this is not essential. In fact, electromagnetic radiation of other wavelengths or wavelengths or wavelength bands may be used. These include, but are not limited to microwave radiation, millimeter radiation and ultra-violet radiation, infra red radiation. As will become clearer as the present description continues, the sealing materials are chosen to be absorptive at the wavelength or wavelength range of the electromagnetic radiation so that when the radiation is absorbed, the sealing layer(s) swells or softens to form the hermetic seal between the two substrates of the display. It is also noted that as described more fully in connection with the example embodiments that incorporate laser energy to effect the sealing, the wavelength or wavelength range of the electromagnetic radiation is chosen so as to not be substantially absorbed by (and thus significantly heat) one or both substrates of the display; especially if there is temperature sensitive material disposed over the substrate(s).

Certain beneficial characteristics of the hermetic seal and its method of fabrication are set forth presently. It is emphasized that these characteristics are merely illustrative and in no way limiting of the scope of the appended claims.

The example embodiments include heating the sealing material to form the hermetic seal. The hermetic seal beneficially provides a barrier for water so that not more than approximately $10^{-6}$ g/m$^2$-day penetrates the seal. Moreover, the hermetic seal beneficially provides a barrier for oxygen so that not more and approximately $10^{-3}$ ml/m$^2$-day penetrate the seal.

In keeping with the example embodiments, the width of the hermetic seal is relatively small, illustratively less than approximately 1.0 mm. As such, the seal does not significantly impact the size of the package or display (e.g., in OLED display applications).

The temperature generated during the sealing process of the example embodiments will be chosen and controlled so as to not significantly impact the materials (e.g., electrodes and organic layers) within the package (e.g., the OLED display). For instance, the first pixels of OLED displays, which may be located about as near as approximately 1.0 mm from the seal in the example OLED display beneficially are not heated to more than approximately 85° C. during the sealing process of the example embodiments.

As will be appreciated by one of ordinary skill in the art, there are often gases released in the sealing processes. It is noted that the gases released during sealing processes of the example embodiments will not significantly contaminate (if at all) the materials within the package. Finally, the hermetic seal of the example embodiments enables electrical connections (e.g., thin-film chromium leads) to be conveniently provided to the interior of the OLED display.

FIG. 1 is a top plan view of a first substrate 101 having a sealing layer 102 disposed thereover in accordance with an illustrative embodiment. As shown, the sealing layer is disposed perimetrically over a surface 103 of the substrate. In order to maximize the sealed area of the device, the sealing layer 102 is located perimetrically just inside of the outer edges 104 of the substrate 101.

It is noted that the distance (d) between the sealing layer 102 and the outer edge 104 of the substrate 101 may be substantially the same. However, this is not essential. Moreover, the distance from the sealing layer 102 to the edge 104 may vary by location over the surface 103. Finally, the sealing layer 102 does not have to be substantially the same shape as the shape of the substrate 101. For example, the sealing layer 102 may be elliptical and the substrate 101 may be rectangular.

In the example embodiment of FIG. 1, the sealing layer 102 is of substantially the same shape as the shape of the substrate (i.e., rectangular). Of course, this is merely illustrative and the shape of the sealing layer may be one of a variety of shapes depending on packaging or manufacturing requirements, for example. Regardless of the shape of the sealing layer 102, the sealing layer 102 is substantially continuous (i.e., without appreciable gaps or breaks) about the perimeter of the substrate, especially after heating the sealing layer by illustrative methods to form a hermetic seal according to example embodiments.

In example embodiments related to displays and optical devices, the substrate 101 may be at least partially transparent, depending on the viewing surface chosen. Of course, this is not essential. However, it is beneficial for the material chosen for the substrate to be substantially non-absorbing at an emission wavelength of a laser or over emission wavelength ranges of lasers used to effect the sealing by heating the sealing layer 102. Illustratively, the substrate 101 may comprise a borosilicate glass material. For example, in applications such as OLED display packages, the substrate 101 may be a transparent glass plate such as that manufactured and sold by Corning Incorporated under the brand names of Code 1737 glass or Eagle 2000™ glass. Alternatively, the substrate plate 101 may be a transparent glass plate such as those manufactured and sold by the companies such as Asahi Glass Co. (e.g., OA10 glass and OA21 glass), Nippon Electric Glass Co., NHTechno and Samsung Corning Precision Glass Co.

As mentioned, in certain example embodiments, the materials chosen for the substrates comprise glass. However, the substrates may be a ceramic material, or other suitable material. To wit, the material choice is application driven. In embodiments in which the transparency of the glass required in viewing applications is not required, other materials may be used as the substrate 101. It is emphasized, however, that the material chosen for the substrate 101 must be substantially non-absorbing of electromagnetic radiation at a chosen wavelength or over a chosen wavelength range used in the sealing process of example embodiments. Moreover, the methods and apparati of the example embodiments may be used in other applications than those described. For example, the methods and apparati of the example embodiments may be used in microreactor applications, where channels between plates of substantially inert material(s) (e.g., glass) can be used to introduce chemicals that form a reaction product(s). Furthermore, the methods and apparati of the illustrative embodiments may be used to provide sealing of a wide variety of thin film devices that require hermeticity, such as semiconductor thin-film devices.

The sealing layer 102 can be provided in a variety of materials, but is generally non-porous, and is not a frit material. Moreover, the sealing layer 102 is of a material chosen substantially to absorb electromagnetic radiation over a certain wavelength or wavelength range so that melting and sealing occurs. To this end, it is useful to choose a material that absorbs approximately at least approximately 30 percent of the energy of the electromagnetic radiation at the wavelength or over the wavelength range of the radiation. Usefully, the material absorbs at least approximately 65 percent of the energy of the electromagnetic radiation at wavelength or over the wavelength range of the radiation. In addition, it is noted that absorption of less than approximately 25 percent of the electromagnetic energy is insufficient to adequately effect the sealing, and may degrade other components such as conductive materials used for electrodes. Finally, in addition to the sealing requirements of the material chosen for the sealing layer 102, sealing layer must be substantially electrically insulating so electrical circuitry (e.g., anode and cathode conductors) may traverse the seal and supply power to electrical devices that are within the seal.

In accordance with certain example embodiments the material comprises glass that is doped by known doping techniques with an absorbing material such as a transition metal or a rare-earth metal. In an example embodiment, the sealing layer 102 may be a borosilicate (multicomponent) glass that is doped with at least one transition metal or rare earth metal including, but not limited to as iron, copper, vanadium, manganese, cobalt, nickel, chromium, neodymium and/or cerium iron, copper, vanadium manganese, cobalt, nickel or chromium. The compositions of several illustrative sealing glass materials useful as the sealing layer 102 are provided in the Example section below. It is emphasized that these materials are merely for purposes of example and are not in any way an exhaustive list of materials useful in the methods and apparati of the example embodiments. Certainly, other materials may be used to provide hermetic sealing through the methods and apparati of the example embodiments may be used.

In keeping with the example embodiments, it is useful to choose materials and wavelengths/wavelength ranges of the electromagnetic radiation so that the sealing glass absorbs the electromagnetic radiation at the wavelength or the wavelength range. As mentioned, the source of the radiation may be a laser. For purposes of illustration, Cerium containing glasses have strong absorption at 355 nm and have been successfully sealed using a pulsed 355 nm laser. Some illustrative materials that usefully absorb light in the visible, ultra violet and infra red bands are provided in the Examples section herein below.

Figure 2:
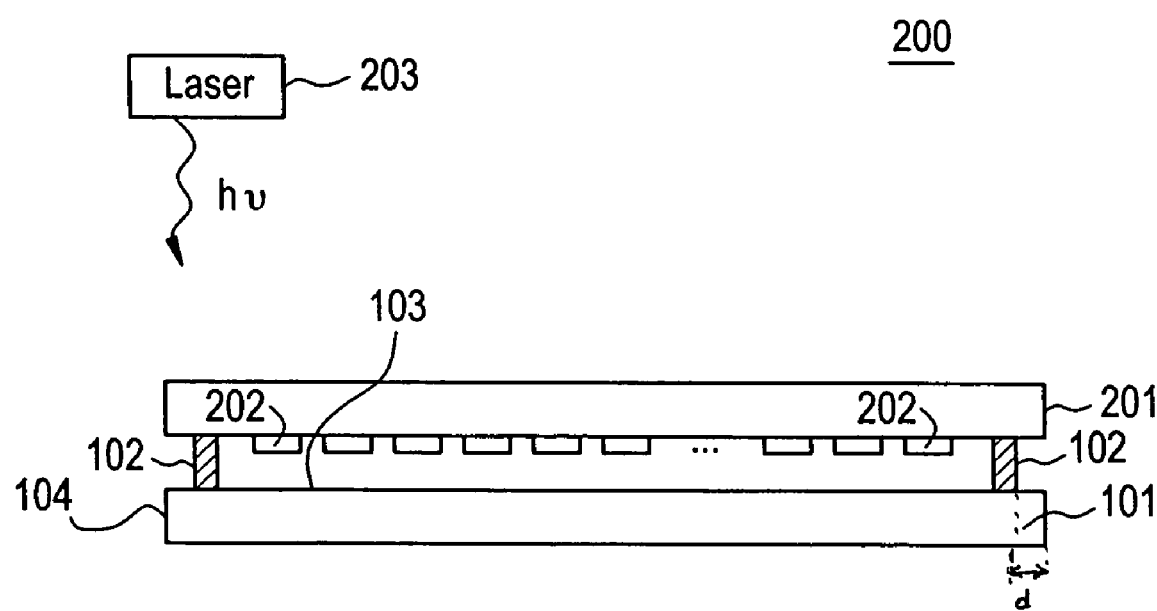
FIG. 2 is a cross-sectional view of an apparatus for providing a hermetic seal in accordance with an example embodiment.

FIG. 2 is a cross-sectional view of an OLED display structure 200 and apparatus for sealing the structure in accordance with an illustrative embodiment. The structure 200 includes the substrate 101 and sealing material 102, and another substrate 201 disposed over the substrate 101. A plurality of OLEDs 202 is disposed over the substrate 201. Illustratively, the OLEDs 202 are disposed in an array and are driven by a transistor array (not shown), such as a thin-film complementary metal oxide semiconductor transistor (CMOS TFT) array formed over the substrate 201. Such electronic devices and their methods of fabrication are well within the purview of one of ordinary skill in the art. Although not shown, an anode and a cathode, as well as other electrical circuitry traverse the sealing layer 102 and are in contact with the circuitry that drives the OLEDs 202.

As will be described further below, the sealing layer 102 may be disposed over the first substrate 101 by methods of example embodiments. The sealing layer 102 does not cover the entire surface of the substrate 101, but rather is in the form of a frame over the surface as shown. In certain example embodiments, the sealing layer 102 is initially bonded to the substrate 101.

Regardless of the method chosen to dispose the sealing material, after the substrate 201 is disposed over the substrate 101, it is in contact with the sealing layer 102. In an example embodiment, the substrate 201 is of substantially the same dimensions as the substrate 101, and thus the sealing layer 102 is normally located perimetrically just inside of the outer edges of the substrate 201. Of course, it is not essential that the substrates have the same dimensions. However, the sealing layer 102 would always be placed so as to substantially optimize the hermetic seal between the first and second substrates, while providing the described internal clearance, and/or space needed for the OLEDs, the electrical circuitry, and/or other elements packaged within the substrate.

With the sealing layer perimetrically disposed over the first substrate 101 and between the first substrate 101 and the second substrate 201, a laser 203 is used to heat the sealing layer so that it bonds to the substrate 201 and forms a hermetic seal between the first and second substrates 101 and 201, respectively. Illustratively, the laser is an integral unit and includes a lens (not shown) that focuses light from the laser onto the sealing layer 102. After the heating process is completed, the OLEDs 202 are sealed by the sealing layer 102, which protects the OLEDs 202 from contaminants such as water and oxygen. In another example embodiment, the sealing layer 102 is not initially bonded to the first substrate 101. Rather, the sealing layer 102 is an integral element or multiple pieces of sealing material that is placed over the first substrate 101 and over which the second substrate 201 is disposed. Next, the laser 203 is used to melt the sealing layer 102 to both the first substrate and the second substrate.

While in the present example embodiments, the source of electromagnetic radiation is a laser, this is not essential. In alternative embodiments, the laser 203 may be replaced by another type of radiation source that emits electromagnetic radiation at a particular wavelength or over a particular wavelength range. For example, the source could be a maser or other microwave source; or a millimeter wave source. The material of the sealing layer 102 is chosen so to absorb the electromagnetic radiation at this wavelength or over this wavelength range in order to effect the sealing by the layer 102 of the substrates 101 and 201.

It is noted that the dimensions of the sealing layer may be altered during this heating step due to melting and bonding to the substrate 201. To wit, the sealing layer may become 'wider' and 'flatter' as can be appreciated. Moreover, the light from the laser 203 may be incident on the sealing layer 102 through the substrate 101 (i.e., the laser may be located beneath the substrate 101 rather than above substrate 201 as shown). An illustrative method of providing the sealing is described presently.

FIG. 3 is a flow-chart of a method of sealing a structure 300 in accordance with an example embodiment. At step 301, a first substrate is provided. Illustratively, this substrate might be the substrate 101 previously described. At step 302 a layer of light absorbing sealing material is disposed over the first substrate. In an example embodiment, this light absorbing sealing material might be the sealing layer 102 described previously.

At step 303, a second substrate is disposed over the first substrate and has a surface that contacts the second substrate. The second substrate illustratively includes the OLED array or OLED devices that were previously described in conjunction with FIG. 2.

At step 303, the application of laser radiation selectively over the first substrate, or the second substrate, results in the heating of the sealing layer through absorption of the light by the sealing layer material. However, and beneficially, the heating is highly localized and thus materials, which may be temperature sensitive (e.g., the OLED material) that are desirably hermetically sealed, are not exposed to the heat of the sealing process. Accordingly, at the completion of step 304, a hermetically sealed package of the example embodiments is provided that at least meets the requirements of hermeticity described above. Moreover, the thermal constraints on the sealing process described previously are also met.

It is noted that in an alternative example embodiment, the sealing layer is first sealed to substrate 101 and then later sealed to substrate 201, using the heating methods described previously in connection with the example embodiments. As can be appreciated, this affords a two-step sealing method.

Illustrative benefits of the example embodiments include providing the hermetic seal while substantially avoiding the exposure of any temperature-sensitive materials or components (e.g., organic materials and OLEDs) to excessive heat. Certain considerations that foster these desired results as well as other benefits of the methods of the example embodiments are described presently.

As mentioned previously, the heating of the sealing material at step 304 is performed by using a laser 203 that emits laser radiation through an optional lens (not shown) and through the first substrate 101 or the second substrate 201, or both, so as to heat the sealing layer. The substrates (e.g., substrate 101 and 201) not appreciably absorb the laser energy, which helps minimize heat dissipation to organic layers in the OLEDs, or other temperature sensitive materials or components that may be sealed between the two substrates. Moreover, the laser 203 is moved such that it effectively heats the sealing layer 102 and causes the sealing layer 102 to soften or melt (i.e., become less viscous) and form the hermetic seal between the substrates 101, 201 without significantly impacting the other components or materials. To wit, the laser emits light at a specific wavelength or over a specific wavelength range and the sealing layer 102 is doped with comprises materials and/or is doped with materials such as rare-earth or transition metal ions so as to enhance its light absorption property at the specific wavelength or wavelength range of the laser emission.

Because of the efficient absorption of heat energy in sealing layer 102, the laser beam 112 can be moved relatively quickly over the substrate and form the hermetic seal. As can be appreciated, the ability to move the laser beam relatively quickly further significantly minimizes the undesirable transfer of heat that can be generated during the forming of the hermetic seal. By virtue of the methods and apparati of the example embodiments, the OLEDs 202 are not heated to more than approximately 85° C. during the operation of the laser 203. Illustrative sealing materials, substrate materials and lasers useful in effecting hermetic seals in keeping with example embodiments are described herein.

As referenced previously, the sealing layer 102 may be disposed over the substrate 101 in accordance with certain example embodiments. An illustrative method of disposing the sealing layer 102 is described in conjunction with FIGS. 4a and 4b.

Figure 4A:
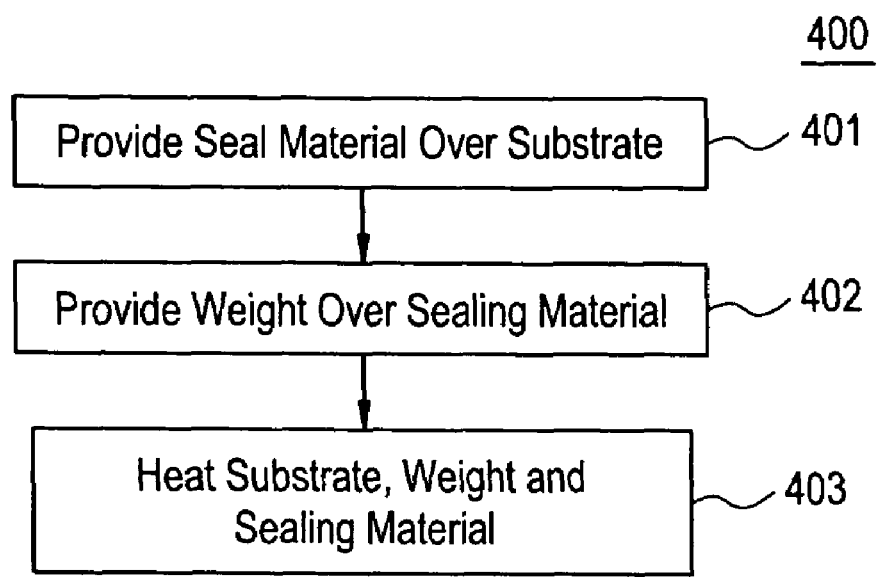
FIG. 4a is a flow chart of a method of disposing the sealing material over a substrate in accordance with an example embodiment.

FIG. 4a is a flow-chart of a method of disposing the sealing layer (e.g., 102) over the substrate (e.g., first substrate 101) in accordance with an example embodiment. An apparatus that may be used in conjunction with the illustrative method of FIG. 4a is shown in FIG. 4b.

At step 401, sealing material is provided over the substrate, which does not include temperature sensitive materials or elements. At step 402 a weight 402, which may include grooves or other guides to position the sealing material is disposed over the sealing material; and at step 403 the substrate, weight and sealing material are heated via laser irradiation to bond the sealing material to the substrate, thereby forming the sealing layer 102.

Figure 4B:
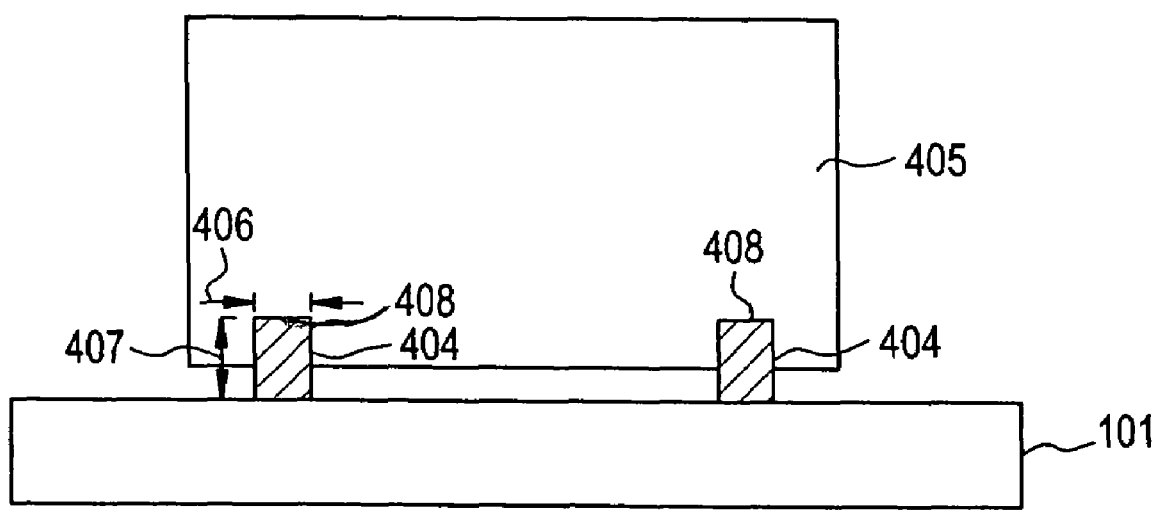
FIG. 4b is a cross-sectional view of an apparatus used to dispose a sealing layer over a substrate in accordance with an example embodiment.

In the example embodiment of FIG. 4b, sealing material 404 is disposed in a groove 408 that is formed in a weight 405. The groove 408 has the desired shape of the sealing layer, which may be rectangular as shown in FIG. 1 or of another shape as referenced previously.

The weight 405 is disposed over the substrate 101, and is made of a material that is substantially inert. For example, the weight 405 may be made of graphite. Accordingly, the weight 405 will not bond to the sealing material 404, but will provide the needed force to form the sealing layer 102 into its desired shape. To wit, in an example embodiment, the sealing material has a height (H) 407 and a width (W) 406, and illustratively the height 407 is greater than the width 406 before the heating sequence. Beneficially, this configuration enables a "column" of sealing material to be shaped with rectangular (or other shape) cross-section.

After the sealing material 404 is disposed in the groove 408, the weight 405 is disposed over the substrate. Next, the weight 405, sealing material 404 and substrate 101 are heated via laser irradiation in an inert environment at approximately 700° C. for approximately 10 hours. Upon completion of the heating sequence the sealing layer 102 is formed and is bonded to the substrate 101, whereupon the weight is removed. Thereafter, the method of sealing of the example embodiment of FIG. 3 may continue at step 303, for example. Beneficially, after the heating sequence, the aspect ratio (H/W) of the sealing layer 102 is less than approximately 1.0, providing a relatively wide and thin sealing layer. This results in an improved sealing structure, which does not contribute significantly to the thickness of the package or display structure.

It is noted that it is not essential to initially bond the sealing material 404 to the substrate 101 as described in connection with FIG. 4b. To this end, another weight (not shown) that is substantially identical to weight 405 may be disposed in the position of the substrate 101 in FIG. 4b.

Thus, the sealing material will be disposed in a groove in each weight. After a heating sequence such as described above, the sealing layer may be removed from the grooves and disposed over the substrate 101 (e.g., per step 302). Thereafter the method of the example embodiment of FIG. 3 can continue at step 303.

Figure 5A:
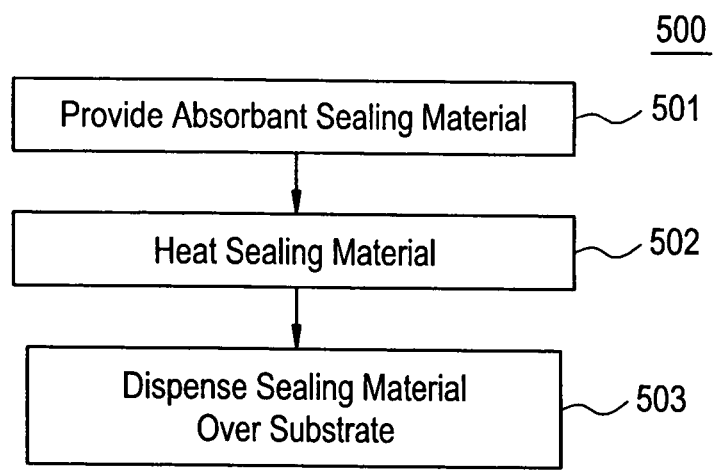
FIG. 5a is a flow chart of a method of disposing the sealing material over a substrate in accordance with an example embodiment.
Figure 5B:
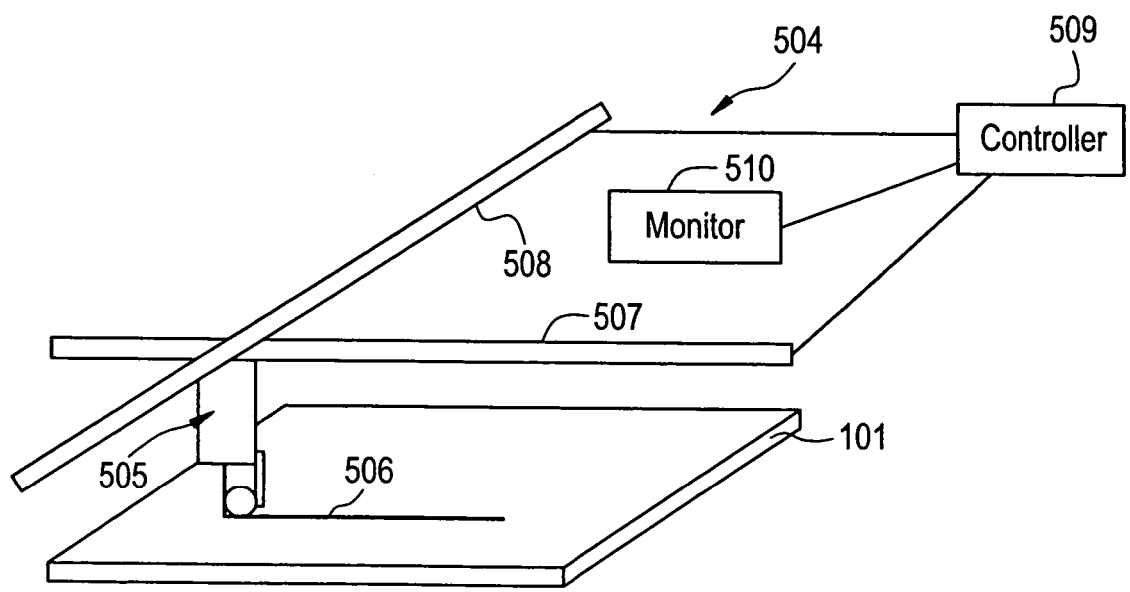
FIG. 5b is a conceptual view of an apparatus for dispensing the sealing material over a substrate in accordance with an example embodiment.

Another method of forming a sealing layer over a substrate in accordance with an example embodiment is described in connection with FIGS. 5a and 5b. In the example embodiment of FIG. 5a, a method of disposing the sealing layer is described. FIG. 5b shows an apparatus of an example embodiment for effecting the illustrative method of FIG. 5a. This method and apparatus would be used, for example, at step 302 of FIG. 3.

At step 501, light absorbing sealing material is loaded into a dispenser. At step 502, the sealing material is heated to a viscosity that it may be dispensed; and at step 503 the sealing material is dispensed over the substrate (e.g., substrate 101). It is noted that the sealing material may be one of those described in connection with the example embodiments or examples herein.

The apparatus 504 includes a unit 505, which usefully heats sealing material disposed therein, and dispenses the material 506 over the substrate 101 in a workable (e.g., flowable or molten) state. The unit 505 is guided by an x-axis guide 507 and a y-axis guide 508, which are in turn controlled by a controller 509. Furthermore, the height (z-axis) is controlled by the controller 609. A monitor 510, which is illustratively a charge coupled device (CCD) camera, provides feedback to the controller including data of the width and height of the sealing material 506, its rate of deposition, or other data useful in the deposition process. It is noted that the unit 505 may include a valve or similar known device to facilitate the control of the deposition of the sealing material 506.

In operation, the unit 505 heats the sealing material disposed therein. This heating may be effected with an integral inductive heater (not shown), for example. Moreover, the unit may include a device to control the pressure applied to the sealing material as it is dispensed. Accordingly, the unit may control the viscosity and velocity of the material that is dispensed. Moreover, the unit 505 may be coupled to the controller 509 that sets the heating level and pressure.

In operation, the unit 505 is guided along the x-axis and y-axis guides 507, 508, respectively, at some height along a z axis, and dispenses the material 506 over a pattern that is set and controlled by the controller 509. Moreover, based on the feedback from the monitor 510, the rate of the unit and the rate at which the material 506 is dispensed may be adjusted or otherwise controlled. Thereby, from the controller 509, monitor 510 and unit 505, the volume, aspect ratio and pattern of the material 506 may be carefully controlled.

It is noted that the x,y axis guides (507, 508), the unit 505 and the monitor 510 are well known in manufacturing technologies that may be implemented in keeping with the example embodiments. To wit, the x,y axis guides (507, 508) may be linear rails, and the unit 505 may be driven and controlled by known devices such as compumotors or robotics. The monitor 510 may be, for example, a manufacturing grade charged coupled device (CCD) camera or its equivalent.

EXAMPLES

The tables below and their accompanying description provide certain examples for the materials for the substrates (e.g., substrates 101, 201) and for the sealing layer (e.g., layers 201, 506) of the example embodiments described in connection with FIGS. 1-5b. It is emphasized that the materials and their compositions are provided for illustrative purposes.

In Table 1 below, illustrative sealing materials (columns 1-6) have a different type, or concentration, or both of oxides such as $Fe_2O_3$, PbO, CuO, ZnO, and SrO. It is noted that some of these elements are not transitional and some of these elements were not added to induce absorption. The sealing glass materials in these embodiments have an enhanced optical absorption in the near-infrared region and in particular at a wavelength of approximately 810 nm wavelength. Thus, the selection of transition-metal dopants is based on the glass absorption at the laser wavelength that is illustratively approximately 810 nm. In addition, the substrate is of a material that does not significantly absorb light having a wavelength of approximately 810 nm. In example embodiments, these materials provided the desired level of hermeticity. Furthermore, the OLED material was not exposed to temperatures greater than approximately 85° C., at least in part due to the material properties of the substrate and sealing material.

TABLE 1

| | Composition Mole % | | | | | | | |
|---|---|---|---|---|---|---|---|---|
| | 1* | 2* | 3* | 4* | 5* | 6* | 7* | 8* |
| $SiO_2$ | 79.8 | 79.5 | 79.2 | 78.6 | 47 | 47 | 47 | 47 |
| $Na_2O$ | 5.3 | 5.3 | 5.3 | 5.2 | 0 | 0 | 0 | 0 |
| $Al_2O_3$ | 1.2 | 1.1 | 1.1 | 1.1 | 9.0 | 9 | 9 | 9 |
| $B_2O_3$ | 13.7 | 13.7 | 13.6 | 13.5 | 27 | 27 | 27 | 27 |
| $Fe_2O_3$ | 0 | 0.4 | 0.8 | 1.6 | 0 | 0 | 0 | 0 |
| PbO | 0 | 0 | 0 | 0 | 7 | 0 | 0 | 0 |
| CuO | 0 | 0 | 0 | 0 | 10 | 17 | 10 | 10 |
| ZnO | 0 | 0 | 0 | 0 | 0 | 0 | 7 | 0 |
| SrO | 0 | 0 | 0 | 0 | 0 | 0 | 0 | 7 |

It is noted that in addition to the aforementioned compositions listed in Table 1, there may be other compositions of substrate plates and sealing materials. Some, like those listed in Tables 3-5, or those that have yet to be developed, but could be connected to one another in accordance with the example embodiments to make a desirable OLED display (e.g., display 200).

The optical absorption measurements from several experiments along with the physical properties of the illustrative substrates 101, 201 and illustrative sealing materials 102 are provided below in Table 2.

TABLE 2

| | Composition | | | | | | | | | |
|---|---|---|---|---|---|---|---|---|---|---|
| | 1* | 2* | 3* | 4* | 5* | 6* | 7* | 8* | 1737 | Eagle 2000 |
| Fe$_2$O$_3$ or CuO Mole % | 0 | 0.4 | 0.8 | 1.6 | 10 | — | — | — | — | — |
| Thickness (mm) | 2.02 | 2.04 | 2.12 | 2.1 | 0.66 | — | — | — | — | — |
| Transmission % at 810 nm | 92.11 | 46.77 | 15.66 | 0.63 | 0.48 | — | — | — | — | — |
| Absorption coefficient,/mm | 0 | 0.144 | 0.363 | 1.031 | 3.46 | — | — | — | — | — |
| % Absorbed in 100 micron layer | 0 | 3 | 7.4 | 19.4 | 50.5 | — | — | — | — | — |
| % Absorbed in 200 micron layer | 0 | 5.9 | 14.2 | 34.8 | 73.3 | — | — | — | — | — |
| Thermal Expansion (ppm/° C.) to strain point | — | — | — | 3.9 | 3.7 | 3.0 | 3.35 | 4.2 | 4.2 | 3.61 |
| Annealing Temperature (° C.) | — | — | — | — | — | 482 | 526 | 526 | 721 | 722 |
| Strain Point (° C.) | — | — | — | — | — | 443 | 486 | 488 | 666 | 666 |

(*These compositions are associated with the illustrative sealing material 102.)

As can be appreciated from the data of Table 2, the desired degree of laser energy absorption can be achieved by: (1) selecting the particular transition metal (s) or rare earth metal(s) to be incorporated within the sealing material 102 and (2) selecting the concentration or amount of transition metal(s) or rare earth metal(s) to be incorporated within the sealing material 102.

Described below are additional glass compositions of the sealing material and additional laser wavelengths that can be used to form hermetic seals displays in accordance with example embodiments, such as those described in connection with FIGS. 1, 2, 4a and 4b. In particular, additional glass compositions are described below that are suitable for sealing OLED displays 200 using an 810 nm infrared (IR) laser 203. Also, glass compositions are described below that are suitable for sealing OLED displays (e.g., display 200) using a 532 nm visible laser 203. Moreover, glass compositions are described below that are suitable for sealing OLED displays 200 using a 355 nm ultraviolet (UV) laser for laser 203. Each of these glass compositions are described in detail below with respect to Tables 3-5.

Referring to IR absorbing glasses, in the text and experiments described above with respect to Tables 1 and 2, the IR absorbing glass materials, which contained transition metal elements, had a strong absorption in the infrared range for sealing with an 810 nm laser. However, some of the aforementioned glasses, such as composition nos. 5-8 listed in Table 1 which had over approximately 10.0 mole % of a transition metal tended to have a dull appearance after pouring and annealing due to the formation of a copper oxide layer on the surface. In these copper borosilicate glasses, it was found that the oxidation phenomenon was dependent on copper and alumina concentrations in the doped glass. In contrast, the surface appearance of the glass composition no. 9 (Table 3A) which has a lower Cu plus some Fe did not have a dull appearance and performed well in a 85° C./85RH hermetic performance test (>500 hours).

TABLE 3A

| | comp. #9 | |
|---|---|---|
| oxides | mole % | weight % |
| SiO$_2$ | 58.5 | 52.06 |
| Al$_2$O$_3$ | 4 | 6.04 |
| B$_2$O$_3$ | 28 | 28.87 |
| Na$_2$O | 0 | 0 |
| V$_2$O$_5$ | 0 | 0 |
| Fe$_2$O$_3$ | 1.5 | 3.55 |
| CuO | 8 | 9.42 |

Also, in experiments, optical transmission data had been obtained which indicated that there are interactions between some transition metal ions which give rise to significantly higher absorption than predicted by the sum of the individual elements. For instance, glass compositions nos. 10-11 (Table 3B) have shown that vanadium ions have a strong interaction with copper and iron ions.

TABLE 3B

| | comp. no. 10 | | comp. no. 11 | |
|---|---|---|---|---|
| oxides | mole % | weight % | mole % | weight % |
| SiO$_2$ | 81.84 | 72.37 | 81.84 | 77.16 |
| Al$_2$O$_3$ | 1.21 | 1.82 | 1.21 | 1.94 |
| B$_2$O$_3$ | 10.56 | 10.83 | 10.56 | 11.53 |
| Na$_2$O | 5.38 | 4.9 | 5.38 | 5.22 |
| V$_2$O$_5$ | 2 | 5.36 | 1 | 2.86 |
| Fe$_2$O$_3$ | 2 | 4.7 | 0 | 0 |
| CuO | 0 | 0 | 1 | 1.25 |

This synergistic effect of the interaction of metal ions also occurred in glass composition nos. 12-17 (Table 3C). As can be seen in Table 3C, the increase of absorbing ions by 50% in going from glass composition no. 13 to glass composition no. 17 resulted in the absorption increasing roughly fourfold.

TABLE 3C

| Oxide | comp. no. 12 | comp. no. 13 | comp. no. 14 | comp. no. 15 | comp. no. 16 | comp. no. 17 | comp. no. 18 | comp. no. 19 | comp. no. 20 |
|---|---|---|---|---|---|---|---|---|---|
| | mole % | | | | | | | | |
| $SiO_2$ | 65.6 | 68.6 | 69.6 | 69.6 | 69.6 | 67.1 | 73 | 73 | 50 |
| $Al_2O_3$ | 4 | 4 | 4 | 4 | 4 | 4 | 1 | 1 | 9 |
| $B_2O_3$ | 24.2 | 24.2 | 24.2 | 24.2 | 24.2 | 24.2 | 23.6 | 23.6 | 30 |
| $Li_2O$ | 0.2 | 0.2 | 0.2 | 0.2 | 0.2 | 0.2 | 1.5 | 1.5 | 0 |
| $Na_2O$ | 0 | 0 | 0 | 0 | 0 | 0 | 0.5 | 0.5 | 0 |
| $K_2O$ | 0 | 0 | 0 | 0 | 0 | 0 | 0.4 | 0.4 | 0 |
| ZnO | 0 | 0 | 0 | 0 | 0 | 0 | 0 | 0 | 3 |
| $Fe_2O_3$ | 0 | 1 | 1 | 1 | 0 | 1.5 | 0 | 0 | 8 |
| $V_2O_5$ | 2 | 1 | 0 | 1 | 1 | 1.5 | 2 | 4 | 0 |
| CuO | 0 | 0 | 0 | 0 | 0 | 0 | 1 | 1 | 0 |
| $TiO_2$ | 2 | 1 | 1 | 0 | 1 | 1.5 | 0 | 0 | 0 |
| NiO | 0 | 0 | 0 | 0 | 0 | 0 | 0 | 0 | 0 |
| $MnO_2$ | 0 | 0 | 0 | 0 | 0 | 0 | 0 | 0 | 0 |
| CTE | | | | | | | 34 | 41 | na |
| 810 abs | 0.6 | 4.8 | 0.5 | 4 | 0.2 | 18.8 | na | na | na |
| Glassy? | yes | yes | yes | yes | yes | | yes | yes | phase sep |

However, referring to glass composition nos. 18-19 (Table 3C) it can be seen that by exceeding certain levels of some elements, for instance V, can result in an increase in the CTE to undesirable values. And, referring to glass composition no. 20 it can be seen that when compositions have too much $Fe_2O_3$ this can result in phase separation.

In view of the data in Tables 3A-3C, an example composition range for sealing materials that absorb in the infra red and that can be used in this embodiment of the present invention has been determined and is listed in TABLE 3D:

TABLE 3D

| Oxide | Mole % |
|---|---|
| $Fe_2O_3$ | approximately 0.0 to approximately 5.0 |
| $V_2O_5$ | approximately 0.0 to approximately 4.0 |
| $TiO_2$ | approximately 0.0 to approximately 5.0 |
| CuO | approximately 0.0 to approximately 10.0 |
| NiO | approximately 0.0 to approximately 3.0 |
| $B_2O_3$ | approximately 8.0 to approximately 30.0 |
| $Al_2O_3$ | approximately 1.2 to approximately 12.0 |
| $Li_2O$ | approximately 0.0 to approximately 2.0 |
| $Na_2O$ | approximately 0.0 to approximately 6.0 |
| $K_2O$ | approximately 0.0 to approximately 3.0 |
| MO | approximately 0.0 to approximately 3.0 (M = Mg, Ca, Sr, Ba, Zn) |
| Other | approximately 0.0 to approximately 3.0 |
| $SiO_2$ | Balance, typically approximately 45.0 to approximately 80.0 |

Referring now to visible absorbing glasses, these glasses typically contain cobalt ions so they have a very strong absorption in the visible region (450-650 nm) and weaker absorption in the IR region. There are several visible glass composition families that can act as successful hosts to cobalt ions. Examples of these visible glass compositions are shown in Table 4A. As can be seen, the relatively high boron glass composition nos. 20-23 have the advantage that they have lower softening and strain points, which means that sealing can be accomplished at somewhat lower laser energy which in turn means the sealing is less likely to cause seal stresses. On the other hand, the relatively high boron glasses and in particular glass composition no. 22 have a greater tendency to undergo phase separation. This phenomenon can be triggered by excessive transition metal additions.

TABLE 4A

| oxide | (comp. 20) | (comp. no 21) | (comp. no 22) | (comp. no 23) |
|---|---|---|---|---|
| | mole % | | | |
| $SiO_2$ | 80.8 | 79.8 | 78.8 | 77 |
| $Al_2O_3$ | 1.2 | 1.2 | 1.2 | 0 |
| $B_2O_3$ | 10.6 | 10.6 | 10.6 | 21.4 |
| $Li_2O$ | 0 | 0 | 0 | 0 |
| $Na_2O$ | 5.4 | 5.4 | 5.4 | 0 |
| $K_2O$ | 0 | 0 | 0 | 1.6 |
| $Co_3O_4$ | 2 | 3 | 4 | 1 |
| glassy | yes | yes | phase sep | yes |
| CTE | 42 | 40 | na | 31 |
| abs., mm-1 at 532 nm | | | na | 6 |

The table also shows that in borosilicate glass, $CO_3O_4$ additions are tolerated up to about 3 mole %, after which phase separation takes place, rendering the composition unsuitable for manufacturing. However, in a high boron glass, 1 mole % $CO_3O_4$ appears to be sufficient since it results in an absorption coefficient of 6 mm$^{-1}$, well above the threshold value of about 3 mm$^{-1}$ for successful sealing. It should also be noticed that a low alkali glass like glass composition no. 23 which has a lower CTE than the two lower boron glass composition nos. 20-21 is beneficial.

It should be appreciated that most of the aforementioned materials that strongly absorb in the IR band also absorb strongly in the visible wavelength. In fact, there are several transition metals, alone and in combination, which were listed in the description of IR absorbing glasses that can yield useful visible absorption. However, there are several reasons why it is useful to have a sealing material that is designed to absorb primarily in the visible region. One such reason is that glasses with strong visible absorption and less strong infrared absorption may be easier to manufacture from the standpoint of melting.

In view of the data associated with Table 4A, an example composition range for sealing materials that absorb light in the visible spectrum and that can be used in example embodiments are listed in Table 4B:

TABLE 4B

| Oxide | Mole % |
|---|---|
| *$Co_3O_4$ | approximately 0.5 to approximately 3.0 |
| $B_2O_3$ | approximately 8 to approximately 30.0 |
| $Al_2O$ | approximately 1.2 to approximately 12 |
| $Li_2O$ | approximately 0.0 to approximately 2.0 |
| $Na_2O$ | approximately 0.0 to approximately 6.0 |
| $K_2O$ | approximately 0.0 to approximately 3.0 |
| MO | approximately 0.0 to approximately 3.0 (M = Mg, Ca, Sr, Ba, Zn) |
| Other | approximately 0.0 to approximately 3.0 |
| $SiO_2$ | Balance approximately 45.0 to approximately 80.0 |

It is noted that the use of cobalt as an absorber is beneficial in this application for at least three reasons. First, while cobalt ions do absorb strongly at the useful laser wavelength of 532 nm, they do not absorb nearly as much in the infrared region. Second, since cobalt is such a strong colorant on a molar or weight basis, smaller additions are required to get to useful absorption levels. Third, cobalt is among the most effective additives because of its higher absorption per mole % oxide added.

Referring now to UV absorbing glasses, there are two types of uv-absorbing glasses useful as the sealing material (e.g., sealing layer 102) described below. In the first type, borosilicate glasses with Ce and Ce+Ti additions have been found to give adequate absorption for sealing at 355 nm. Table 5A lists several glass composition nos. 24-26 where Ce and Ti were added to borosilicate glass.

TABLE 5A

| | mole % | | | | |
|---|---|---|---|---|---|
| oxide | (comp. no 24) | (comp. no. 25) | (comp. no. 26) | (comp. no. 27) | (comp. no. 28) |
| $SiO_2$ | 80.8 | 78.8 | 76.8 | 62 | 63.6 |
| $Al_2O_3$ | 1.2 | 1.2 | 1.2 | 6 | 6 |
| $B_2O_3$ | 10.6 | 10.6 | 10.6 | 28 | 25 |
| $Li_2O$ | 0 | 0 | 0 | 0 | 0 |
| $Na_2O$ | 5.4 | 5.4 | 5.4 | 0 | 1.4 |
| $K_2O$ | 0 | 0 | 0 | 0 | 0 |
| $CeO_2$ | 1 | 2 | 2 | 4 | 4 |
| $TiO_2$ | 1 | 2 | 4 | 0 | 0 |
| glassy | yes | Yes | phase sep | Phase sep | yes |
| CTE abs., | 40 | 41 | na | Na | 34 |
| mm-1 355 nm | 6.1 | >10 | na | Na | 5.5 |

As can be seen in Table 5A with respect to glass composition no. 26, when the level of Ti in the borosilicate glass is too high phase separation can result. It can also be seen that an absorption level sufficient for sealing was obtained in glass composition no. 24, although the CTE is a bit high. And, it can be seen in the other high boron glasses like glass composition nos. 27-28 which have lower CTEs and lower strain points that they can be used to make a better seal with substrates which have 40 and below CTEs. However, these high boron glasses also have a greater tendency for phase separation like glass composition no. 27. As such, lower alkali levels may be needed in the high boron glasses to avoid high CTEs. But, lower alkali glasses also give weaker Ce absorption in the UV region. A compromise was reached in glass composition no. 28, where only a small amount of alkali was required to avoid phase separation.

It should be appreciated that the aforementioned UV absorbing glasses are fairly transparent in the visible region (yellow amber color) and have strong absorption at 355 nm. As a result, these UV absorbing glasses may be used to make top emission OLED displays. This may be useful if the market moves from bottom emission displays to top emission displays.

In view of the data in Table 5A, an example composition range for UV absorption Ce and Ti addition sealing glasses (e.g., for sealing layer 102) that can be used in this illustrative embodiment has been determined and is listed in Table 5B:

TABLE 5B

| Oxide | Mole % |
|---|---|
| $CeO_2$ | approximately 1.0 to approximately 4.0 |
| $TiO_2$ | approximately 0.0 to approximately 3.0 |
| $B_2O_3$ | approximately 8.0 to approximately 30.0 |
| $Al_2O_3$ | approximately 1.2 to approximately 12.0 |
| $Li_2O$ | approximately 0.0 to approximately 2.0 |
| $Na_2O$ | approximately 0.0 to approximately 6.0 |
| $K_2O$ | approximately 0.0 to approximately 3.0 |
| MO | approximately 0.0 to approximately 3.0 (M = Mg, Ca, Sr, Ba, Zn) |
| Other | approximately 0.0 to approximately 3.0 |
| $SiO_2$ | Balance (approximately 45 to approximately 80). |

In the second type of UV absorbing glasses, these visibly transparent glasses which are capable of being sealed with 355 nm UV lasers are made by precipitation of CuCl microcrystals in a glass matrix. The precipitation of CuCl in the glass is controlled by the heat treatment, the level of Cu and Cl, the ratio of alkalis to boron, and the redox state of the glass. These glasses possess a very sharp UV cut-off absorption at about 370 nm and, depending on the composition, can have absorption coefficients of over 6 $mm^{-1}$ at 355 nm.

Table 5C illustrates an illustrative range of glass compositions in which CuCl microcrystals can be precipitated. Glass composition no. 29 is equivalent to Corning's Code 8511 glass, and glass composition no. 7 is equivalent to Corning's Spectramax product. As can be seen, the CTE of glass composition no. 29 is too high, but it can be lowered by increasing $SiO_2$ and lowering $Al_2O_3$ and total alkalis ($Li_2O+Na_2O+K_2O$).

TABLE 5C

| | mole % | | | | | | | |
|---|---|---|---|---|---|---|---|---|
| Oxide | comp. no. 29 | comp. no. 30 | comp. no. 31 | comp. no. 32 | comp. no. 33 | comp. no. 34 | comp. no. 35 | Comp. no. 36 |
| $SiO_2$ | 59.7 | 61.2 | 67 | 72.8 | 75.3 | 76.2 | 77.2 | 71.2 |
| $Al_2O_3$ | 11.4 | 2.7 | 3.8 | 4.9 | 2.5 | 1.9 | 1.2 | 1.9 |

TABLE 5C-continued

| Oxide | mole % | | | | | | | |
|---|---|---|---|---|---|---|---|---|
| | comp. no. 29 | comp. no. 30 | comp. no. 31 | comp. no. 32 | comp. no. 33 | comp. no. 34 | comp. no. 35 | Comp. no. 36 |
| $B_2O_3$ | 17.2 | 28.4 | 21.5 | 14.5 | 15.8 | 14.3 | 12.8 | 19.5 |
| $Li_2O$ | 2 | 1.3 | 0.6 | 0 | 0 | 0 | 0 | 0 |
| $Na_2O$ | 4.5 | 5.3 | 5.9 | 6.6 | 5.4 | 5.1 | 4.8 | 7.4 |
| $K_2O$ | 3.2 | 0 | 0 | 0 | 0 | 0 | 0 | 0 |
| CuO | 0.4 | 0.3 | 0.4 | 0.4 | 0.4 | 0.4 | 0.4 | 0.31 |
| $SnO_2$ | 0.5 | 0.8 | 0.5 | 0.7 | 0.7 | 0.7 | 0.7 | 0.15 |
| Br | 0.25 | 0.5 | 0.25 | 0.5 | 0.5 | 0.5 | 0.5 | 0.4 |
| Cl | 0.06 | 0.75 | 0.06 | 0.75 | 0.75 | 0.75 | 0.75 | 1.4 |
| F | 0 | 0 | 0 | 0.75 | 0.75 | 0.75 | 0.75 | 1.3 |
| Glassy | yes | | | | | | | |
| CTE | 59 | 46 | 44 | 43 | 37 | 37 | 34 | Na |
| abs., mm-1 355 nm | | | | | | | | 2.9 |

In view of the data in Table 5C, an example composition range for UV absorption CuCl microcrystal sealing glasses (e.g., for sealing layer 102) that can be used in this embodiment of the present invention has been determined and is listed below in Table 5D:

| Oxide | Mole % |
|---|---|
| $Al_2O$ | approximately 0.0 to approximately 15.0 |
| $B_2O_3$ | approximately 10.0 to approximately 30.0 |
| $Li_2O$ | approximately 0.0 to approximately 3.0 |
| $Na_2O$ | approximately 3.0 to approximately 8.0 |
| $K_2O$ | approximately 0.0 to approximately 4.0 |
| CuO | approximately 0.2 to approximately 1.0 |
| SnO | approximately 0.1 to approximately 1.0 |
| Br | approximately 0.2 to approximately 1.0 |
| Cl | approximately 0.0 to approximately 2.0 |
| F | approximately 0.0 to approximately 6.0 |
| $CeO_2$ | approximately 0.0 to approximately 3.0 |
| $SiO_2$ | balance, typically approximately 50% approximately 80%. |

In the foregoing discussion related to TABLES 3-5, 1737 or Eagle glass was used as the transparent substrate. However, it should be noted that if another glass, with better UV transparency, was used as the transparent substrate, then one could use a laser wavelength in the transparency region of that substrate glass. For example, if high purity fused silica was used then a 266 nm laser could be used to seal the plates.

The sealing glass (e.g., layer 102) can be drawn into a micro-sheet (typically approximately 0.05 mm to approximately 0.15 mm in thickness). As can be appreciated, the entire sheet is not needed. Rather, the sheet is diced or cut into portions, and these portions are laid over the substrate (e.g., first substrate 101) perimetrically. For example, the portions of the sheet may be provided as shown in FIG. 1, with the portions comprising the sealing layer 102. Alternatively, a sealing layer may be an integral element, which is cut-out of the microsheet into a desired shape. For example, the integral element may be cut into a nearly rectangular shape to form the sealing layer 102. Thereafter, another substrate (e.g., substrate 201) is disposed over the first substrate. As described previously, the first and second substrates are 1737 glass substrates (one with OLEDs and the other is a cover glass with nearly matching thermal expansion).

Illustratively, the portions of the microsheet are composition 7 glass and the sealing may be effected using an 810 nm continuous wave laser (e.g., 11 watts and 15 mm/s translational speed). To prove that the seal is hermetic, a thin layer of calcium film (0.5 microns thick) is deposited on one of the 1737 glass substrates prior to sealing. If the calcium film is not protected, it will react with the moisture in the ambient and loses its metallic appearance in 2-3 hours. The sealed samples are placed in an 85° C./85RH chamber to accelerate diffusion of water molecules through the seal. There was no change in the appearance of the calcium film even after aging 700 hours in 85° C./85RH environment.

It is emphasized that the laser wavelength and the glass composition of the sealing glass are related. To this end, the sealing glass should have absorbing centers to heat the glass with laser energy to facilitate bonding. Successful hermetic seals were demonstrated using laser having emission wavelengths of 355 nm, 532 nm and 810 nm lasers. For 355 nm pulsed laser cerium containing glasses were used due to its higher absorption in the UV region of the optical spectrum. Similarly for 532 nm laser, cobalt containing glasses were used to demonstrate hermetic seals.

The example embodiments having been described in detail in connection through a discussion of exemplary embodiments, it is clear that modifications of the invention will be apparent to one having ordinary skill in the art having had the benefit of the present disclosure. Such modifications and variations are included in the scope of the appended claims.

The invention claimed is:

1. A method, comprising:
providing a first substrate;
providing an electromagnetic radiation absorbent sealing material over a surface of the first substrate;
providing a second substrate over the first substrate, an array of organic light emitting devices (OLEDs) being disposed over a surface of the second substrate; and
heating the sealing material with a source of electromagnetic radiation to soften the sealing material, thereby forming a hermetic seal between the first and second substrates.

2. A method as recited in claim 1, wherein the sealing material comprises a glass material.

3. A method as recited in claim 2, wherein the glass material comprises constituents that absorb the electromagnetic radiation.

4. A method as recited in claim 2, wherein the heating the sealing material comprises focusing light from a laser source on the electromagnetic radiation absorbent sealing material.

5. A method as recited in claim 4, wherein the glass material is doped with a doping material that is absorptive at a wavelength of light emitted from the laser source.

6. A method as recited in claim 5, wherein the first substrate and the second substrate are not appreciably absorptive of the light of the wavelength emitted from the laser source.

7. A method as recited claim 5, wherein the doping material comprises a transition metal or a rare earth metal.

8. A method as recited in claim 1, wherein not more than approximately $10^{-6}$ g/m$^2$-day of water penetrate the hermetic seal.

9. A method as recited in claim 1, wherein not more than $10^{-3}$ ml/m$^2$-day of oxygen penetrates the hermetic seal.

10. A method as recited in claim 1, wherein the first substrate comprises a glass material.

11. A method as recited in claim 1, wherein the second substrate comprises a glass material.

12. A method as recited in claim 1, wherein the electromagnetic radiation is one of: microwave radiation, millimeter wave radiation, infra-red radiation, ultra-violet radiation, or visible light.

13. A method as recited in claim 1, wherein the providing the electromagnetic radiation absorbing sealing material comprises before the providing, heating the sealing material; and the providing further comprises: providing a sealing material in a dispenser; and dispensing the sealing material.

14. A method as recited in claim 13, wherein at least a portion of the first substrate is heated prior to the providing the sealing material.

15. A method as recited in claim 13, wherein at least a portion of the substrate is heated to a temperature between approximately 100° C. and approximately 800° C. prior to the providing the sealing material.

16. A method as recited in claim 1, wherein the sealing material is disposed perimetrically over the surface.

17. A method as recited in claim 1, wherein a distance between the sealing material and an edge of the surface is provided and is substantially constant.

18. A method as recited in claim 1, wherein a distance between the sealing material and an edge of the surface is provided and is not substantially constant.

19. A method of forming a glass package comprising:
providing a first and a second glass substrate, the second glass substrate comprising at least one organic light emitting diode disposed thereon;
dispensing a molten sealing material on the first substrate, the sealing material comprising at least one transition metal or rare earth metal;
disposing the first glass substrate over the second glass substrate;
heating the glass sealing material with a source of electromagnetic radiation to form a hermetic seal between the first and second substrates.

20. The method as recited in claim 19 wherein the at least one transition metal or rare earth metal is selected from the group consisting of iron, copper, vanadium, manganese, cobalt, nickel, chromium, neodymium, and cerium.

21. The method as recited in claim 19 wherein the disposing a fluid sealing material comprises perimetrically dispensing a molten glass.

22. The method as recited in claim 19 wherein the sealing material comprises a microsheet.

23. The method as recited in claim 19 wherein the first and second substrates do not substantially absorb at a wavelength of radiation from the electromagnetic radiation source.

24. The method as recited in claim 19 wherein the electromagnetic radiation source is a laser.

25. The method as recited in claim 19 wherein a temperature of the organic light emitting diode does not exceed about 85° C. during the heating.

* * * * *